United States Patent
Adriano et al.

(10) Patent No.: US 9,941,193 B1
(45) Date of Patent: Apr. 10, 2018

(54) SEMICONDUCTOR DEVICE PACKAGE HAVING SOLDER-MOUNTED CONDUCTIVE CLIP ON LEADFRAME

(71) Applicant: Infineon Technologies Americas Corp., El Segundo, CA (US)

(72) Inventors: Gerald Adriano, Temecula, CA (US); Lalgudi MG Sundaram, El Segundo, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/282,505

(22) Filed: Sep. 30, 2016

(51) Int. Cl.
*H01L 23/495* (2006.01)

(52) U.S. Cl.
CPC .... *H01L 23/49562* (2013.01); *H01L 23/4952* (2013.01); *H01L 23/49548* (2013.01); *H01L 23/49575* (2013.01)

(58) Field of Classification Search
CPC ........... H01L 23/49562; H01L 23/4952; H01L 23/49548; H01L 23/49575
See application file for complete search history.

(56) References Cited

U.S. PATENT DOCUMENTS

| | | | |
|---|---|---|---|
| 9,496,208 B1* | 11/2016 | Ostrowicki | H01L 23/49575 |
| 9,515,060 B2* | 12/2016 | Otremba | H01L 23/49513 |
| 9,620,440 B1* | 4/2017 | Shibuya | H01L 23/49568 |
| 2008/0048342 A1* | 2/2008 | Cheah | H01L 23/49524 257/777 |
| 2008/0054438 A1* | 3/2008 | Germain | H01L 23/4334 257/690 |
| 2009/0261461 A1* | 10/2009 | Sapp | H01L 23/49524 257/666 |
| 2010/0133670 A1* | 6/2010 | Liu | H01L 23/49524 257/675 |
| 2013/0049077 A1* | 2/2013 | Herbsommer | H01L 23/49524 257/288 |
| 2014/0103510 A1* | 4/2014 | Andou | H01L 23/49551 257/676 |
| 2015/0348881 A1* | 12/2015 | Okamoto | H01L 21/4825 438/123 |
| 2016/0336257 A1* | 11/2016 | Choi | H01L 24/40 |
| 2016/0358890 A1* | 12/2016 | Heinrich | H01L 24/16 |

\* cited by examiner

*Primary Examiner* — Michael Jung
(74) *Attorney, Agent, or Firm* — Shumaker & Sieffert, P.A.

(57) ABSTRACT

A conductive clip for a semiconductor device package. In one example, the conductive clip may include a number of protrusions that extend from a surface of the conductive clip that in practice is solder-mounted to a leadframe of the semiconductor device package. In another example, the conductive clip may include the number of protrusions that each extend from the surface of the conductive clip that in practice is solder-mounted to the leadframe of the semiconductor device package, and may also include a number of protrusions that each extend from a surface of the conductive clip that in practice is solder-mounted to at least one electrical component that in turn is solder-mounted to the leadframe of the semiconductor device package.

18 Claims, 8 Drawing Sheets

SEMICONDUCTOR DEVICE PACKAGE HAVING SOLDER-MOUNTED CONDUCTIVE CLIP ON LEADFRAME

BACKGROUND

A half-bridge circuit may include two analog devices or switches. Half-bridge circuits may be used in power supplies, power converters, motors, rectifiers, drivers power electronics, and other applications. Half-bridge circuits are often held within a circuit package. Half-bridge circuit packages may have several contacts and may include several conductive paths or elements to connect the contacts to each other and to external components.

SUMMARY

The present disclosure relates to semiconductor packaging. In particular, the present disclosure relates to a conductive clip for a semiconductor device package. In an example, the conductive clip includes a number of protrusions that each extend from a surface of the conductive clip that in practice is solder-mounted to a leadframe of the semiconductor device package. In another example, the conductive clip includes the number of protrusions that each extend from the surface of the conductive clip that in practice is solder-mounted to the leadframe of the semiconductor device package, and also includes a number of protrusions that each extend from a surface of the conductive clip that in practice is solder-mounted to at least one electrical component that in turn is solder-mounted to the leadframe of the semiconductor device package. In both examples, the protrusions that extend from the surface of the conductive clip that in practice is solder-mounted to the leadframe of the semiconductor device package maintain the thickness of solder between the surface of the conductive clip and the leadframe to a thickness that is greater than or equal to a length of the protrusions as measured from the surface of the conductive clip. By doing so, circuit performance and reliability issues that may manifest due to an overly thin solder connection at the interface between the surface of the conductive clip and the leadframe are prevented.

DETAILED DESCRIPTION

The present disclosure relates to a conductive clip for a semiconductor device package. In an example, the conductive clip includes a number of protrusions that each extend from a surface of the conductive clip that in practice is solder-mounted to a leadframe of the semiconductor device package. In another example, the conductive clip includes the number of protrusions that each extend from the surface of the conductive clip that in practice is solder-mounted to the leadframe of the semiconductor device package, and also includes a number of protrusions that each extend from a surface of the conductive clip that in practice is solder-mounted to at least one electrical component that in turn is solder-mounted to the leadframe of the semiconductor device package. In both examples, the protrusions that extend from the surface of the conductive clip that in practice is solder-mounted to the leadframe of the semiconductor device package maintain the thickness of solder between the surface of the conductive clip and the leadframe to a thickness that is greater than or equal to a length of the protrusions as measured from the surface of the conductive clip. By doing so, circuit performance and reliability issues that may manifest due to an overly thin solder connection at the interface between the surface of the conductive clip and the leadframe are prevented.

Figure 1:
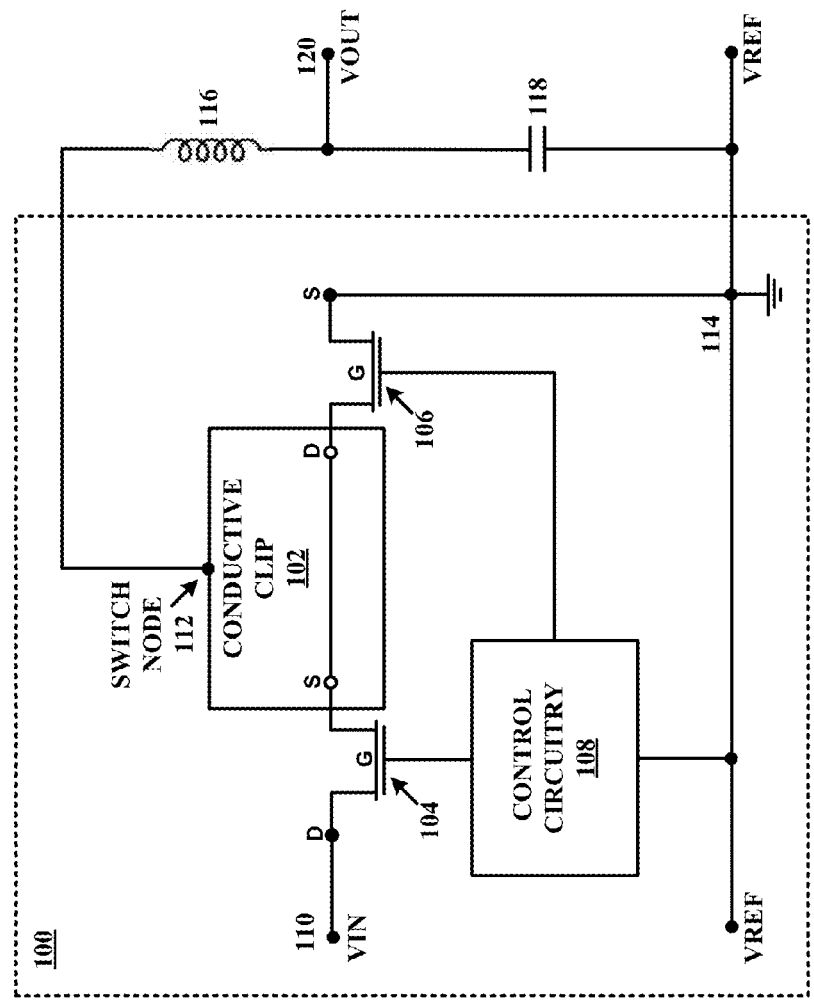
FIG. 1 is a block diagram of a power converter that includes a conductive clip in accordance with the present disclosure.

FIG. 1 is a block diagram of a power converter 100 that includes a conductive clip 102 in accordance with the present disclosure. In general, the conductive clip 102 is configured and/or arranged to exhibit protrusions that extend from a surface of the conductive clip 102 that in practice is solder-mounted to a leadframe of a semiconductor device package. The protrusions maintain the thickness of solder between the surface of the conductive clip 102 and the leadframe to a thickness that is greater than or equal to a length of the protrusions as measured from the surface of the conductive clip 102, as discussed in detail below in connection with FIG. 2.

With respect to the power converter 100, the power converter 100 may comprise a multi-phase power converter, such as a half-bridge direct-current-to-direct-current (DC-to-DC) buck converter for converting an input DC signal to an output DC signal with a stepped-down voltage. For each phase, a multi-phase power converter may comprise a half-bridge circuit and an inductor. As a DC-to-DC buck converter, the power converter 100 may operate as a voltage regulator in a variety of applications. In some examples, the power converter 100 may be designed for high-power applications that leverage high currents and/or voltages. However, the techniques of the present disclosure may apply to other circuits and configurations, such as other power converters and including multi-phase power converters.

In the example shown, the power converter 100 includes transistors 104, 106, and control circuitry 108 coupled together in a particular topology. Although, the power converter 100 may contain more or fewer components than depicted in FIG. 1. The power converter 100 further includes an input node 110, a switch node 112 and a reference node 114, as well as other nodes not explicitly shown in FIG. 1. In general, each one of the nodes 110, 112 and 114 is configured to connect to one or more external components. For example, the input node 110 may connect to a power supply, the switch node 112 may connect to an inductor 116 that in turn is series-connected with a capacitor 118 as shown in FIG. 1, and the reference node 114 may connect to a reference voltage, such as reference ground. Additionally, the control circuitry 108 may connect to an external circuit through a node (not shown). The inductor 116 and the capacitor 118 are each depicted in FIG. 1 as being external the power converter 100. In some examples, however, the power converter 100 may include one or both the inductor 116 and the capacitor 118.

Although each one of the transistors 104, 106 is depicted in FIG. 1 as a metal-oxide semiconductor field-effect transistor (MOSFET), it is contemplated that any electrical device whose electrical properties are voltage-controllable may be used. For example, the transistors 104, 106 may comprise bipolar junction transistors (BJTs), insulated-gate bipolar transistors (IGBTs), high-electron-mobility transistors (HEMTs), gallium-nitride-based transistors, and/or other elements that are voltage-controllable. The transistors 104, 106 may comprise n-type transistors or p-type transistors. For example, an n-type MOSFET may include an n-channel for electrons to flow through a p-substrate between load terminals. In some examples, the transistors 104, 106 may comprise other voltage-controlled devices such as diodes. The transistors 104, 106 may also include freewheeling diodes connected in parallel with transistors to prevent reverse breakdown of the transistors 104, 106. In some examples, the transistors 104, 106 may operate as switches or as voltage-controlled resistor devices.

In an example, the transistors 104, 106 may comprise vertical power transistors. For a vertical power transistor, the source terminal and the drain terminal may be on opposite sides or opposite surfaces of the transistor. Drain-source current in a vertical power transistor may flow through the transistor from top-bottom or from bottom-top. In still other examples, the transistors 104, 106 may include more than two transistors, such as in multi-phase power converters or other more complex power circuits. For example, in a multi-phase power converter, the power converter 100 may have one high-side transistor and one low-side transistor for each phase. Therefore, a multi-phase power converter may include one or more replications of the power converter 100 as depicted in FIG. 1.

FIG. 1 depicts the transistors 104, 106 with three terminals: drain (D), source (S), and gate (G). The drain and source may be load terminals, and the gate may be a control terminal. Current may flow between the drain and source of the transistors 104, 106 via the conductive clip 102 based on the voltage at the gate. More specifically, current may flow from the input node 110 to the switch node 112, which corresponds to the conductive clip 102, through the drain and source of the transistor 104 based on the voltage at the gate of the transistor 104. Current may flow from the switch node 112, which corresponds to the conductive clip 102, through the drain and source of transistor 106 to the reference node 114, based on the voltage at the gate of the transistor 106. The transistor 104 may comprise a high-side transistor, and the transistor 106 may comprise a low-side transistor.

The transistors 104, 106 may comprise various material compounds, such as silicon (Si), silicon carbide (SiC), gallium nitride (GaN), or any other combination of one or more semiconductor materials. To take advantage of higher power density requirements in some circuits, power converters may operate at higher frequencies. Improvements in magnetics and faster switching, such as GaN switches, may support higher frequency converters. These higher frequency circuits may require control signals to be sent with more precise timing than for lower frequency circuits.

The control circuitry 108 may deliver modulation signals, such as pulse-width modulated (PWM) signals, pulse density modulation (PDM) signals, or other modulation signals to the control terminals of the transistors 104, 106. FIG. 1 depicts the control circuitry 108 as one component, but the control circuitry 108 may comprise a modulation control circuit and a driver circuit as separate components. In such an implementation, one or both of the PWM control circuit and the driver circuit may be located external to the power converter 100. Together, the conductive clip 102, the transistors 104, 106 and the control circuitry 108 as shown in FIG. 1 may comprise a semiconductor device package, such as a chip-embedded substrate, an integrated circuit, or any other suitable package.

The inductor 116 may comprise a coil inductor or any suitable inductor. The inductor 116 may connect to the switch node 112 and the output node 120. The inductor 116 may impede the flow of alternating-current (AC) electricity, while allowing DC electricity to flow between the switch node 112 and the output node 120.

The capacitor 118 may comprise a film capacitor, an electrolytic capacitor, a ceramic capacitor, or any suitable type of capacitor or capacitors. The capacitor 118 may connect to the output node 120 and the reference node 114. The capacitor 118 may impede the flow of DC current, while allowing AC current to flow between the output node 120 and the reference node 114. The capacitor 118 may act as a smoothing capacitor for the voltage at the output node 120 to moderate fluctuations in the voltage at the output node 120.

Figure 2:
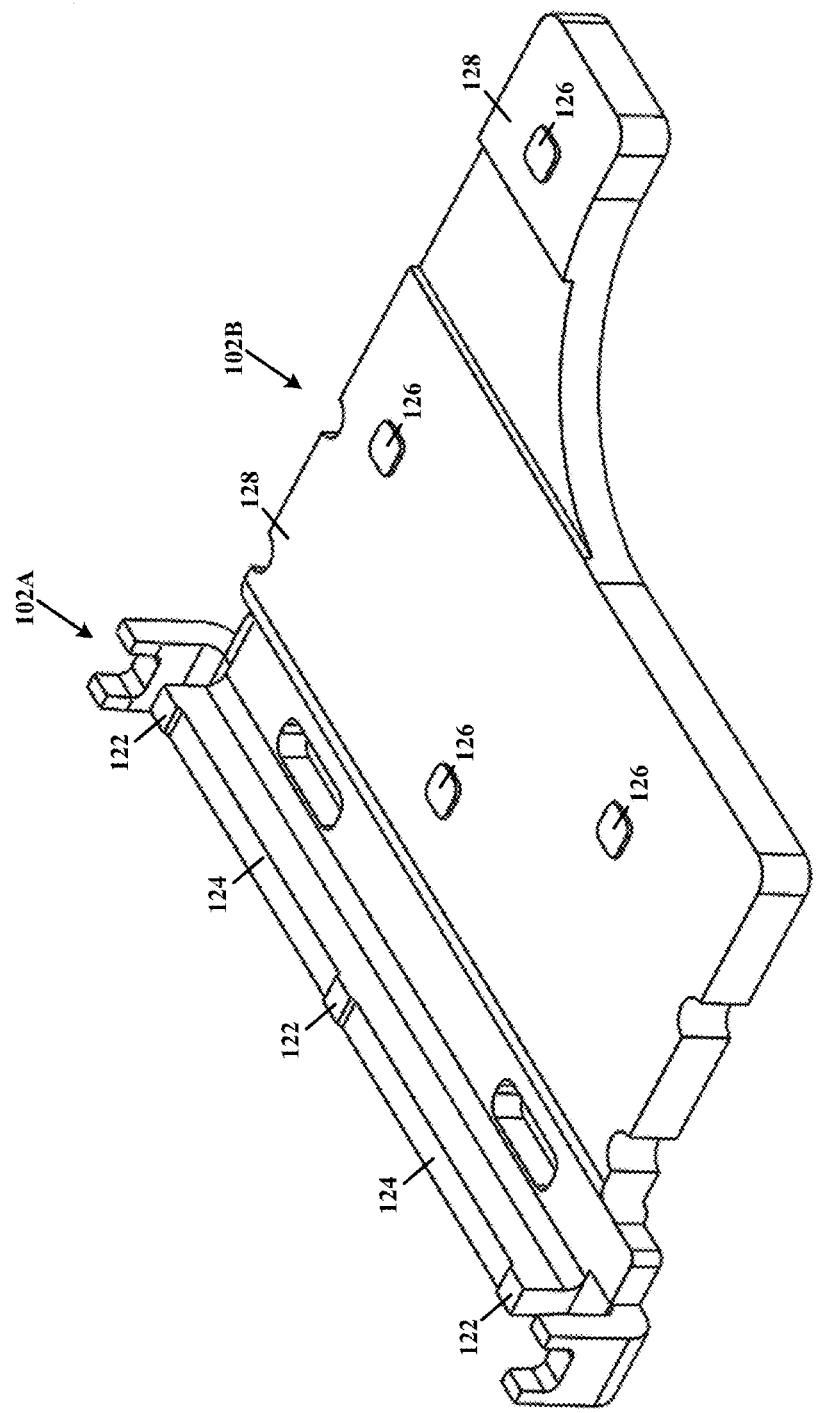
FIG. 2 is a perspective view of the conductive clip of FIG. 1.

As mentioned above, the conductive clip 102 of the power converter 100 is configured and/or arranged to exhibit protrusions that extend from a surface of the conductive clip 102 that in practice is solder-mounted to a leadframe of a semiconductor device package. The protrusions maintain the thickness of solder between the surface of the conductive clip 102 and the leadframe to a thickness that is greater than or equal to a length of the protrusions as measured from the surface of the conductive clip 102. FIG. 2 is a perspective view of the conductive clip 102 of FIG. 1.

In the example of FIG. 2, the conductive clip 102 includes a number of protrusions 122 that each extend from a surface 124 of a foot segment 102A of the conductive clip 102. In practice, the conductive clip 102 is solder-mounted to a leadframe of a semiconductor device package along the surface 124 of the foot segment 102A of the conductive clip 102. Optionally, the conductive clip 102 includes a number of protrusions 126 that each extend from a surface 128 of a body segment 102B of the conductive clip 102. In practice, the conductive clip 102 is solder-mounted along the surface 128 of the body segment 102B of the conductive clip 102 to at least one electrical component that in turn is solder-mounted to the leadframe of the semiconductor device package. An example of such a semiconductor device package is shown in FIGS. 3-6.

Figure 3:
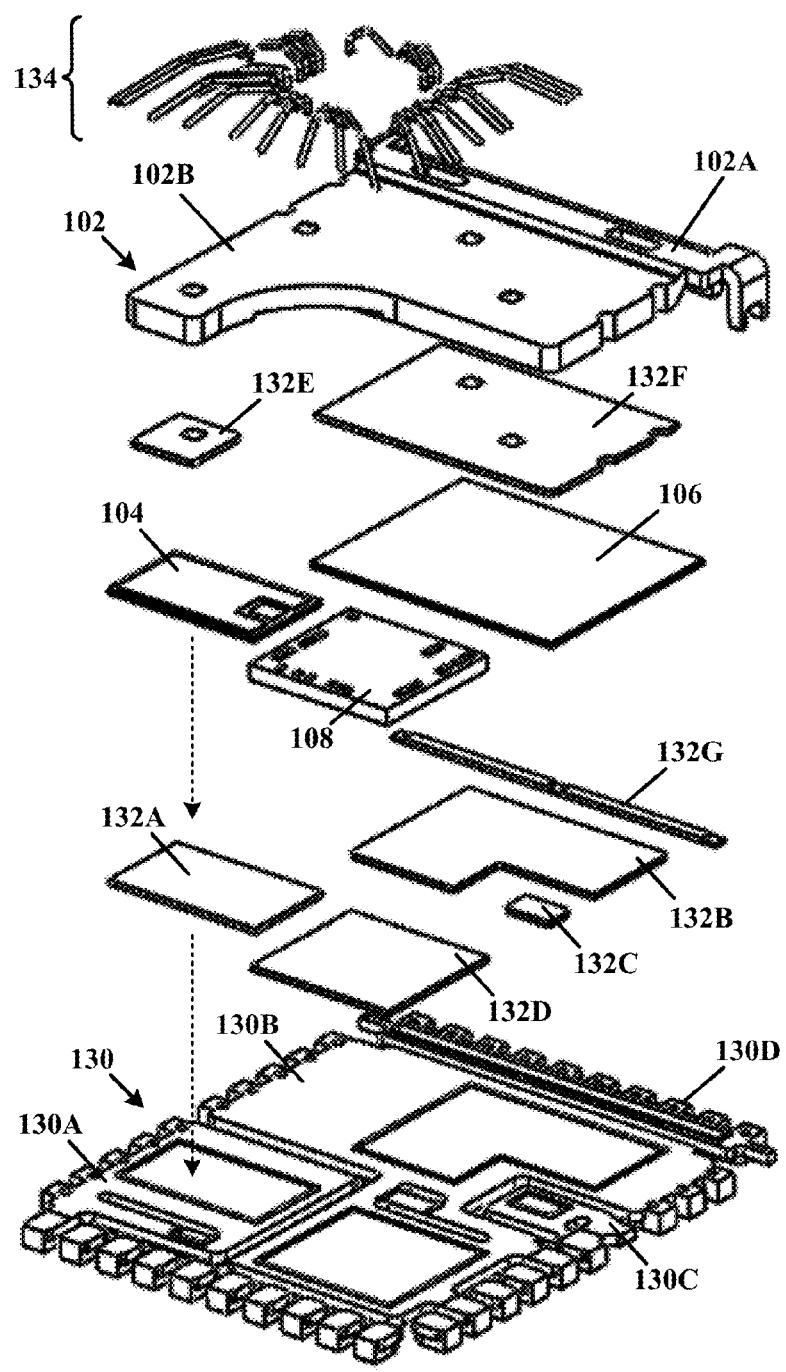
FIG. 3 is an exploded view of a semiconductor device package that includes the power converter, and the conductive clip, of FIG. 1.
Figure 4:
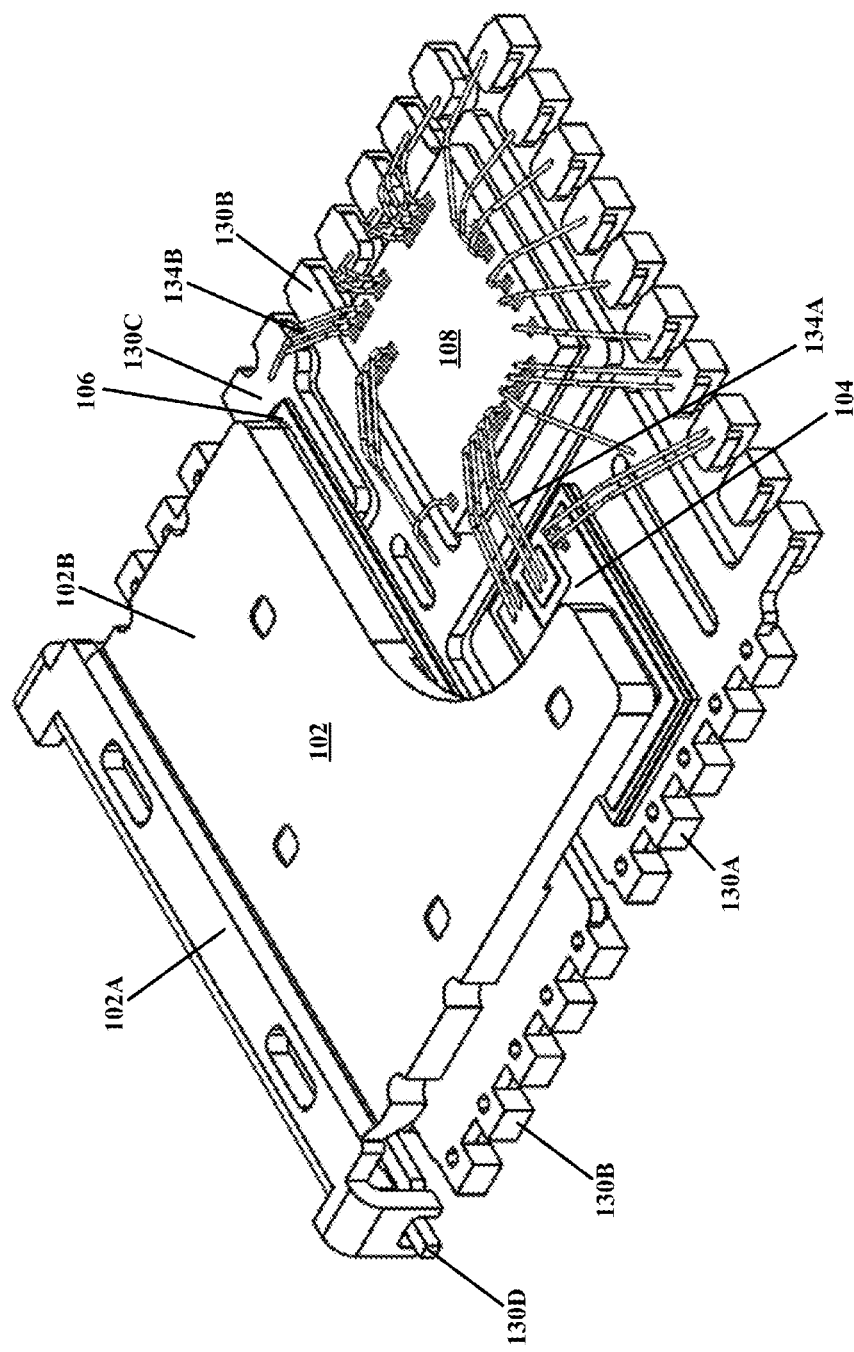
FIG. 4 is a first perspective view of the semiconductor device package of FIG. 3.
Figure 5:
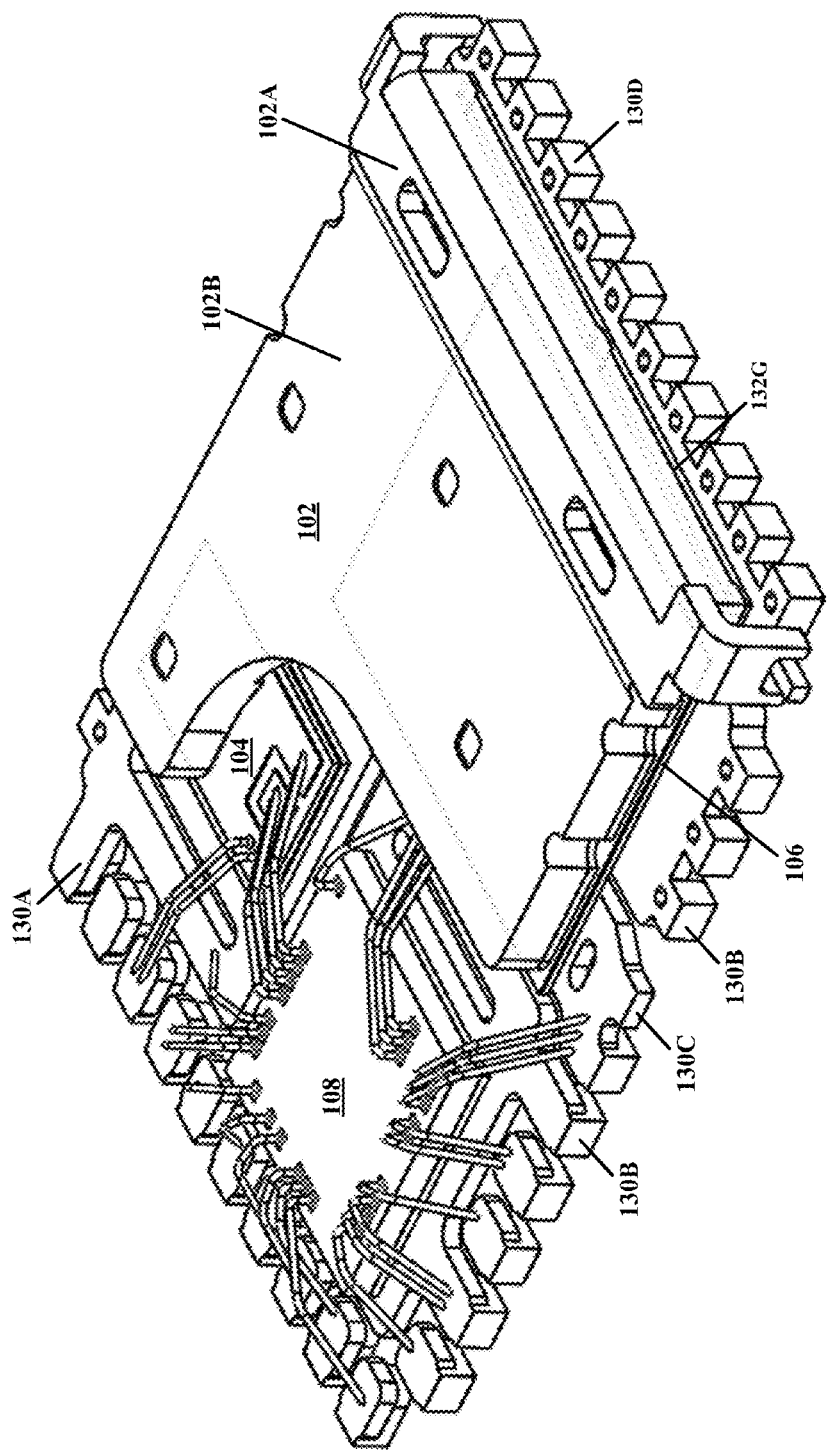
FIG. 5 is a second perspective view of the semiconductor device package of FIG. 3.
Figure 6:
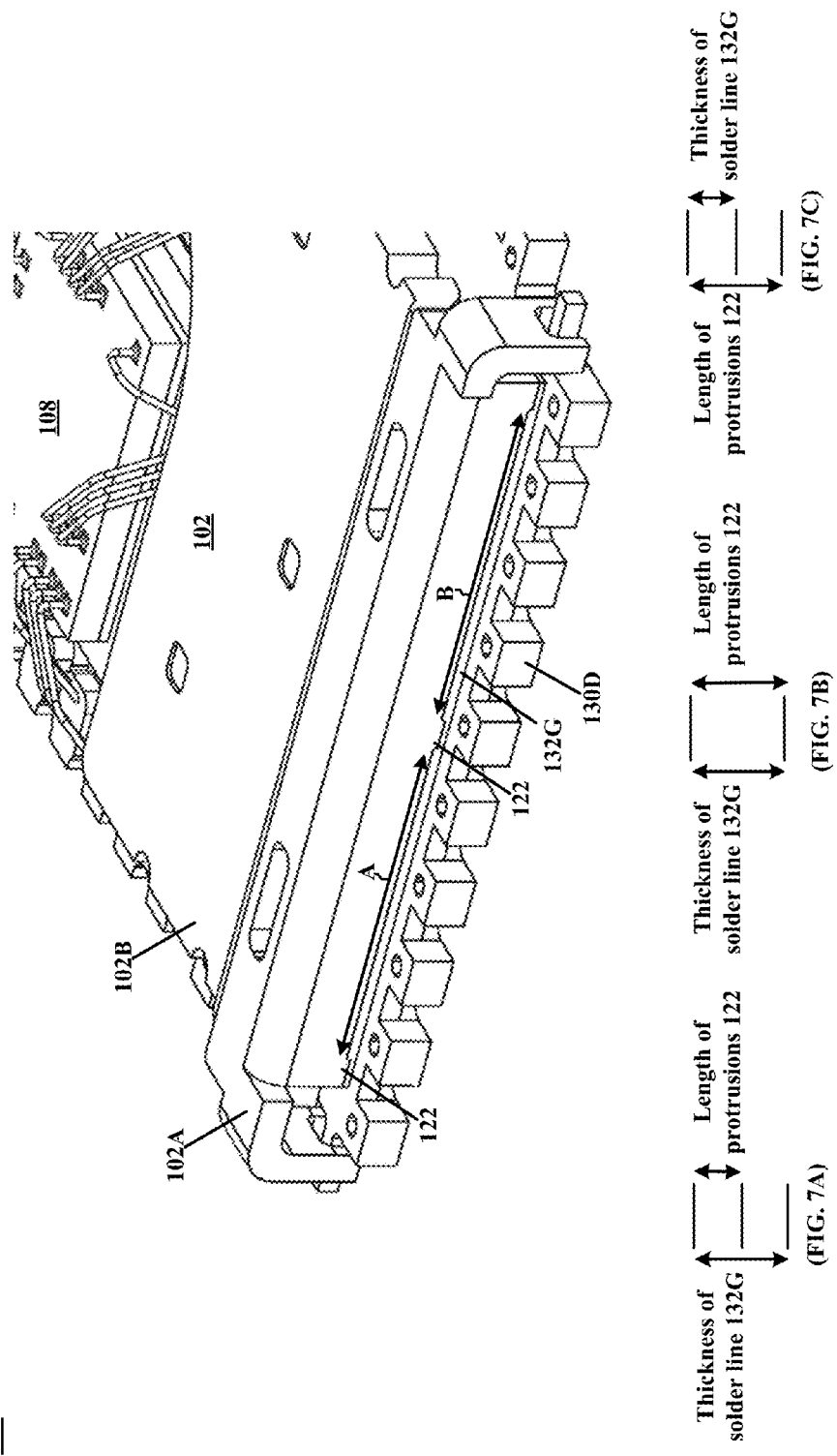
FIG. 6 is a third perspective view of the semiconductor device package of FIG. 3.

FIG. 3 is an exploded view of a semiconductor device package 200 that includes the power converter 100, and the conductive clip 102, of FIG. 1. FIG. 4 is a first perspective view of the semiconductor device package 200 of FIG. 3. FIG. 5 is a second perspective view of the semiconductor device package 200 of FIG. 3. FIG. 6 is a third perspective view of the semiconductor device package 200 of FIG. 3.

With reference to FIG. 3, the example semiconductor device package 200 includes a segmented leadframe 130, and each one of the transistors 104, 106 and the control circuitry 108 is solder-mounted to the leadframe 130 by corresponding solder pads. In turn, the conductive clip 102 is solder-mounted to each one of the transistors 104, 106 and to the leadframe 130 by corresponding solder pads. For example, the drain terminal of the transistor 104 (see FIG. 1) is solder-mounted to a first segment 130A of the leadframe 130 by a solder pad 132A. This is illustrated by intermittent line in FIG. 3.

Additionally, the source terminal of the transistor 106 (see FIG. 1) is solder-mounted to a second segment 130B of the leadframe 130 by a solder pad 132B, and the gate terminal of the transistor 106 is solder-mounted to a third segment 130C of the leadframe 130 by a solder pad 132C. The control circuitry 108 is solder-mounted to the second segment 130B of the leadframe 130 by a solder pad 132D. In turn, the conductive clip 102 is solder-mounted to the source terminal of the transistor 104 (see FIG. 1) along the surface 128 (see FIG. 2) of the body segment 102B of the conductive clip 102 by a solder pad 132E and is solder-mounted to the drain terminal of the transistor 106 along the surface 128 of the body segment 102B of the conductive clip 102 by a solder pad 132F. Last, the conductive clip 102 is solder-mounted to a fourth segment 130D of the leadframe 130 along the surface 124 (see FIG. 2) of the foot segment 102A of the conductive clip 102 (see FIG. 2) by a solder line 132G.

In this example, the transistors 104, 106 comprise vertical power transistors whereby the drain terminal of the transistor 104 is connected to a portion of the leadframe 130, the first segment 130A, that corresponds to the input node 110 (see FIG. 1) of the power converter 100, and the source terminal of the transistor 106 is connected to a portion of the leadframe 130, the second segment 130B, that corresponds to the reference node 114 of the power converter 100. The source terminal of the transistor 104 and the drain terminal of the transistor 106 are however connected to a portion of the leadframe 130, the fourth segment 130D, that corresponds to the switch node 112 of the power converter 100.

Accordingly, electrical connection between components of the semiconductor device package 200 and components external to the semiconductor device package 200 may be established via the leadframe 130. Electrical connection between components of the semiconductor device package 200 itself may be established via wire bonds 134, either directly or indirectly via the leadframe 130. For example, with additional reference to FIG. 4, a direct electrical connection is established between the control circuitry 108 and the gate terminal of the transistor 104 (see FIG. 1) via wire bond 134A, and an indirect electrical connection is established between the control circuitry 108 and the gate terminal of the transistor 106 via wire bond 134B that is connected to the third segment 130C of the leadframe 130.

As mentioned above, the conductive clip 102 may be solder-mounted to the source terminal of the transistor 104 along the surface 128 of the body segment 102B of the conductive clip 102 by the solder pad 132E, and is solder-mounted to the drain terminal of the transistor 106 along the surface 128 of the body segment 102B of the conductive clip 102 by the solder pad 132F. The conductive clip 102 is also solder-mounted to the fourth segment 130D of the leadframe 130 along the surface 124 of the foot segment 102A of the conductive clip 102 by the solder line 132G. During solder reflow, solder of each one of the solder pad 132E, the solder pad 132F and the solder line 132G is in liquid phase, and the conductive clip 102 is floating on the liquid phase solder and is thus susceptible to pivoting and tilting.

In general, the protrusions 126 as arranged in the staggered pattern along the surface 128 of the body segment 102B of the conductive clip 102 as shown in FIG. 2 stabilize the conductive clip 102 and minimize the extent of pivoting and tilting of the conductive clip 102 during solder reflow. The protrusions 122 as arranged at a particular pitch along the surface 124 of the foot segment 102A of the conductive clip 102 as shown in FIG. 2 maintain the thickness of the solder line 132G to a thickness that is greater than or equal to a length of the protrusions 122 as measured from the surface 124 of the foot segment 102A of the conductive clip 102, regardless of the extent of pivoting and tilting of the conductive clip 102 during solder reflow. The power converter 100 may exhibit performance and reliability issues when the thickness of the solder line 132G is overly thin at areas along the surface 124 of the foot segment 102A of the conductive clip 102.

Performance issues may manifest as a decrease in power efficiency due to an increase in resistance or impedance at the interface between the surface 124 of the foot segment 102A of the conductive clip 102 and the fourth segment 130D of the leadframe 130 when the thickness of the solder line 132G is overly thin along the surface 124, due to an increase in resistance or impedance at the interface between the surface 128 of the body segment 102B of the conductive clip 102 and one or both of the transistors 104, 106 when the thickness of one or both of the solder pads 132E, 134F is overly thin along the surface 128, and due to an increase in resistance or impedance at the interface between the surface 128 of the body segment 102B of the conductive clip 102 and one or both of the transistors 104, 106 when pivoting and tilting of the conductive clip 102 is substantial enough such that the contact area between the surface 128 of the body segment 102B of the conductive clip 102 and one or both of the solder pads 132E, 132F is reduced. Reliability issues may manifest as a decrease in operational lifetime of the power converter 100 due to an increase in built-in stress of the solder line 132G that may increase the risk of degradation of the solder line 132G over time when the thickness of the solder line 132G is overly thin at the interface between the surface 124 of the foot segment 102A of the conductive clip 102 and the fourth segment 130D of the leadframe 130. These effects are illustrated in FIGS. 7A-7C and FIG. 8.

Figure 7:
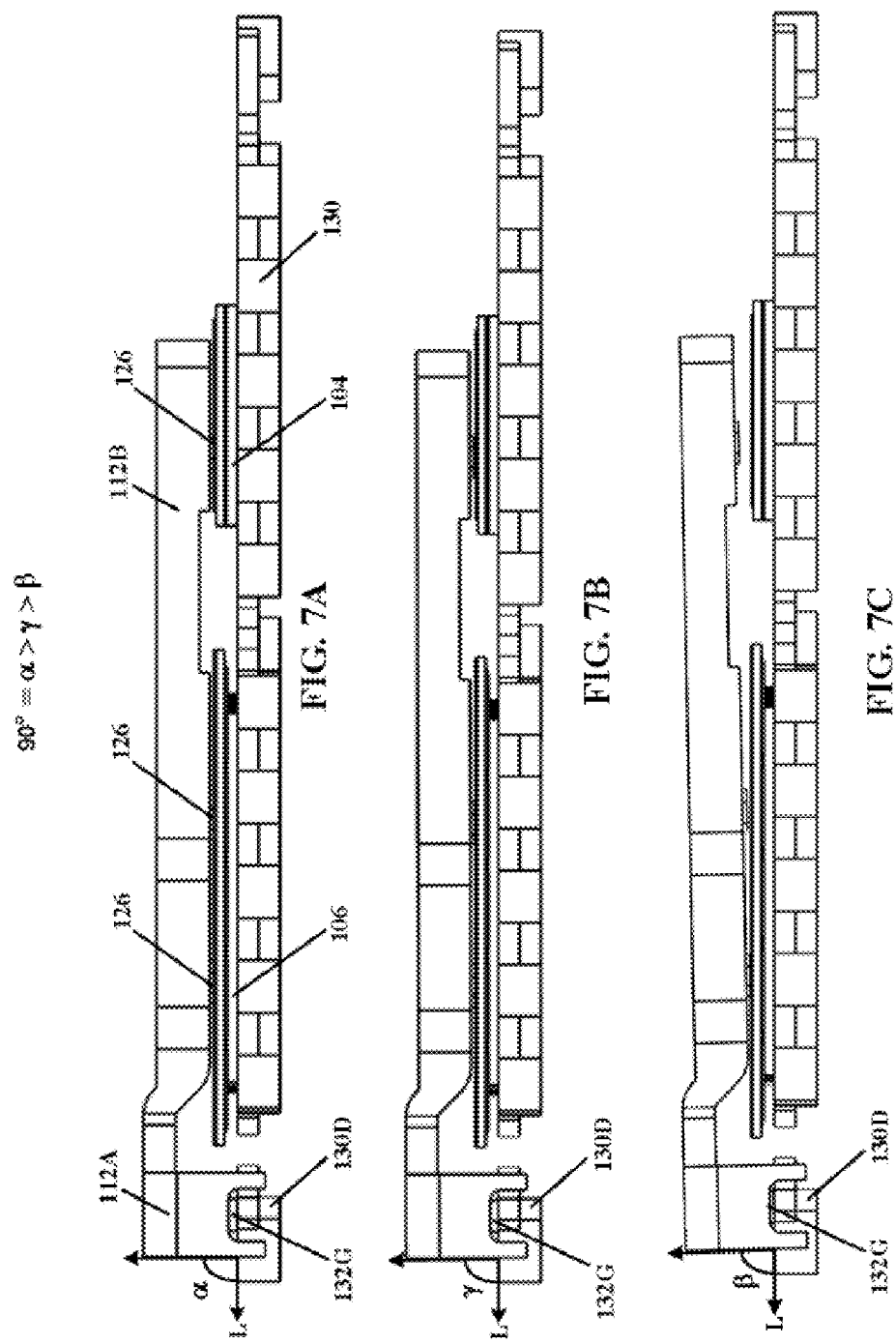
FIG. 7A is a first side view of the semiconductor device package of FIG. 3.
FIG. 7B is a second side view of the semiconductor device package of FIG. 3.
FIG. 7C is a third view of the semiconductor device package of FIG. 3.
Figure 8:
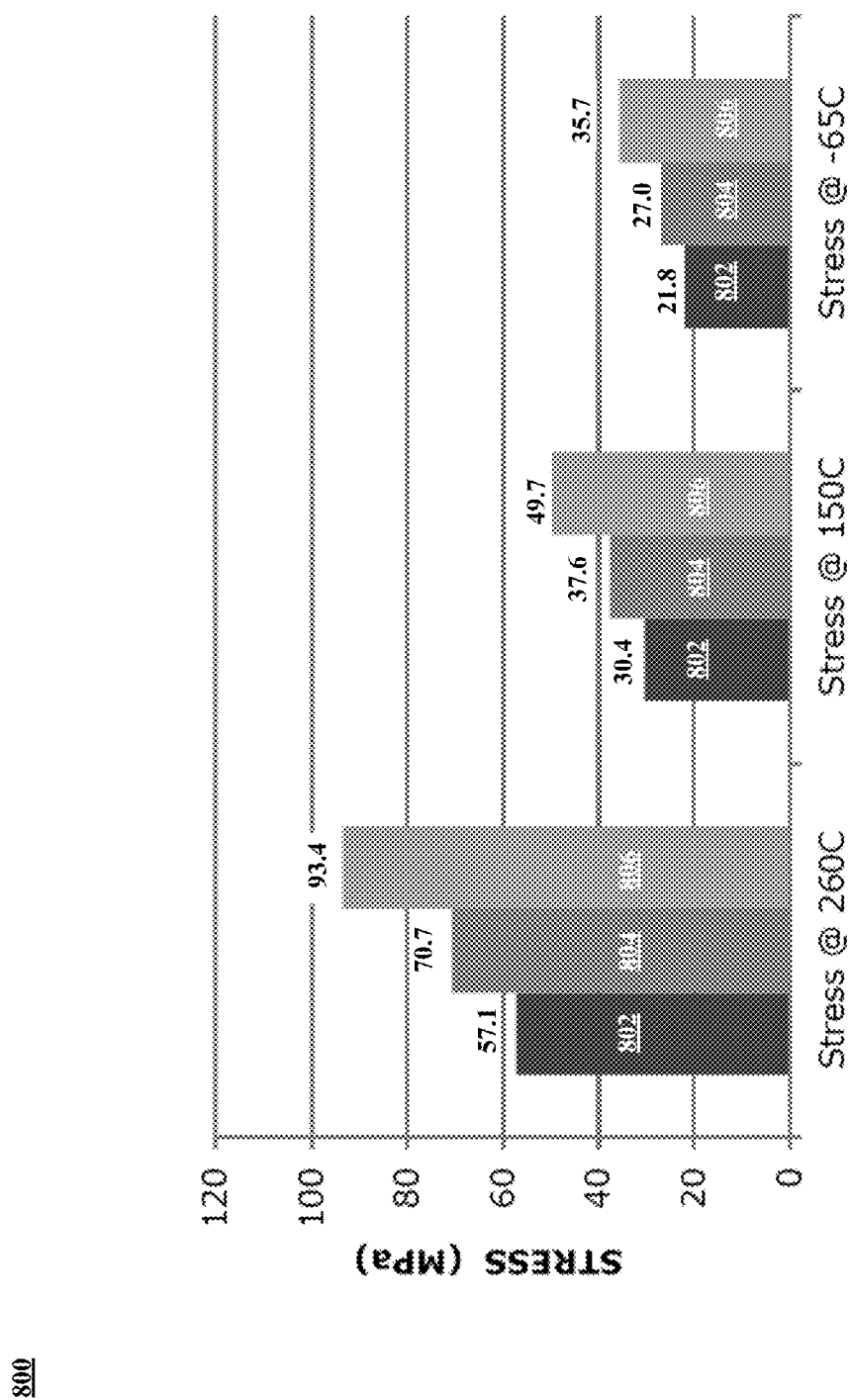
FIG. 8 is plot of data that illustrates solder line stress over temperature for each one of the examples of FIGS. 7A-7C.

FIG. 7A is a first side view of the semiconductor device package 200 of FIG. 3. FIG. 7B is a second side view of the semiconductor device package 200 of FIG. 3. FIG. 7C is a third side view of the semiconductor device package 200 of FIG. 3. FIG. 8 is plot of data that illustrates stress in the solder line 132G over temperature for each one of the examples of FIGS. 7A-7C.

In FIG. 7A, the conductive clip 102 does not exhibit any tilt along the long axis L of the semiconductor device package 200, indicated by the angle α=90°. In this example, the thickness of the solder line 132G along lengths of the surface 124 of the foot segment 102A of the conductive clip 102 between the protrusions 122 is maximum. This is illustrated in FIG. 6, where the thickness of the solder line 132G along lengths A, B of the surface 124 of the foot segment 102A of the conductive clip 102 between the protrusions 122 is maximum, and is greater than a length of the protrusions 122 as measured from the surface 124 of the foot segment 102A of the conductive clip 102. With reference to FIG. 8, built-in stress of the solder line 132G over temperature, indicated by trend 802 at 260° C. (board mount reflow temperature), 150° C. (maximum reliability stress test temperature) and −65° C. (minimum reliability stress test temperature), is shown to be minimized when the conductive clip 102 does not exhibit any tilt along the long axis L of the semiconductor device package 200. Additionally, the thickness of the solder line 132G along the lengths A, B in the example of FIG. 7A is great enough such that resistance or impedance at the interface between the surface 124 of the foot segment 102A of the conductive clip 102 and the fourth segment 130D of the leadframe 130 does not adversely affect the power efficiency of the power converter 100.

In FIG. 7B, the conductive clip 102 exhibits maximum tilt along the long axis L of the semiconductor device package 200, indicated by the angle $\gamma<\alpha=90°$. In this example, the thickness of the solder line 132G along lengths of the surface 124 of the foot segment 102A of the conductive clip 102 between the protrusions 122 is minimum, and is equal to a length of the protrusions 122 as measured from the surface 124 of the foot segment 102A of the conductive clip 102. This is because the top or end surface of the protrusions 122 (see FIG. 2) are in contact with the fourth segment 130D of the leadframe 130, and in the no-tilt scenario (see FIG. 7A) the top or end of surface of the protrusions 126 (see FIG. 2) would be in contact with the source terminal of the transistor 104 and the drain terminal of the transistor 106, respectively, when the top or end surface of the protrusions 122 are in contact with the fourth segment 130D of the leadframe 130, assuming that the length of the protrusions 122 is equal to the length of the protrusions 126. This is illustrated in FIG. 6, where the thickness of the solder line 132G along lengths A, B of the surface 124 of the foot segment 102A of the conductive clip 102 between the protrusions 122 is equal to a length of the protrusions 122 as measured from the surface 124 of the foot segment 102A of the conductive clip 102. With reference to FIG. 8, built-in stress of the solder line 132G over temperature, indicated by trend 804 at 260° C., 150° C. and −65° C., is shown to be greater than when the conductive clip 102 does not exhibit any tilt along the long axis L of the semiconductor device package 200 (see FIG. 7A). Additionally, the thickness of the solder line 132G along the lengths A, B in the example of FIG. 7B is great enough such that resistance or impedance at the interface between the surface 124 of the foot segment 102A of the conductive clip 102 and the fourth segment 130D of the leadframe 130 does not adversely affect the power efficiency of the power converter 100.

In FIG. 7C, the protrusions 122 are omitted from the conductive clip 102 to illustrate the difference between maximum tilt of conductive clip 102 along the long axis L without and with (see FIG. 7B) the protrusions 122. This is indicated by the angle $\beta$, where $90°=\alpha>\gamma>\beta$. In this example, the thickness of the solder line 132G along lengths A, B of the surface 124 of the foot segment 102A of the conductive clip 102 between the protrusions 122 is less than a length of the protrusions 122 as measured from the surface 124 of the foot segment 102A of the conductive clip 102 (using the length of the protrusions 122 as a benchmark even though the protrusions 122 are omitted in this example). This is illustrated in FIG. 6, which is the opposite of that shown and described above in connection with FIG. 7A whereby the thickness of the solder line 132G along lengths A, B of the surface 124 of the foot segment 102A of the conductive clip 102 between the protrusions 122 was shown to be greater than a length of the protrusions 122 as measured from the surface 124 of the foot segment 102A of the conductive clip 102. With reference to FIG. 8, built-in stress of the solder line 132G over temperature in the example of FIG. 7C, indicated by trend 806 at 260° C., 150° C. and −65° C., is shown to be substantially greater than that indicated by trend 804 that is associated with the example of FIG. 7B. Additionally, the thickness of the solder line 132G along the lengths A, B in the example of FIG. 7B is thin enough such that resistance or impedance at the interface between the surface 124 of the foot segment 102A of the conductive clip 102 and the fourth segment 130D of the leadframe 130 does adversely affect the power efficiency of the power converter 100.

As discussed herein, the conductive clip of present disclosure includes a number of protrusions that each extend from a surface of the conductive clip that in practice is solder-mounted to a leadframe of the semiconductor device package. Optionally, the conductive clip of present disclosure may also include a number of protrusions that each extend from a surface of the conductive clip that in practice is solder-mounted to at least one electrical component that in turn is solder-mounted to the leadframe of the semiconductor device package. The protrusions that extend from the surface of the conductive clip that in practice is solder-mounted to the leadframe of the semiconductor device package maintain the thickness of solder between the surface of the conductive clip and the leadframe to a thickness that is greater than or equal to a length of the protrusions as measured from the surface of the conductive clip. By doing so, circuit performance and reliability issues that may manifest due to an overly thin solder connection at the interface between the surface of the conductive clip and the leadframe are prevented.

In an example implementation, a semiconductor device package comprises a leadframe, at least one transistor that is solder-mounted to the leadframe, and a conductive clip that has a first surface and a second surface and that is solder-mounted to the at least one transistor along the first surface, and that is solder-mounted to the leadframe along the second surface by a thickness of solder that is greater than or equal to a length of at least one protrusion that extends from the second surface. The example implementation is consistent with that shown and described in connection with at least FIGS. 7A-7B with reference to the protrusions 122, and it is contemplated that the length of the protrusions 122 may be defined so as to ensure that power efficiency and operational lifetime of circuitry of the semiconductor device package is not compromised or affected. For example, the length of the protrusions 122 may be defined so as to measure 20 μm nominal with a tolerance of +10 μm/−0 μm, which may be equivalent to a minimum solder thickness as defined per specification. In some examples, the length of the protrusions 126 too may be defined so as to measure 20 μm nominal with a tolerance of +10 μm/−0 μm, which may be equivalent to a minimum solder thickness as defined per specification Other examples are possible.

In an example implementation, an end surface of the at least one protrusion abuts the leadframe. The example implementation is consistent with that shown and described in connection with at least FIG. 7B with reference to the protrusions 122 where the protrusions 122 contact the fourth segment 130D of the leadframe 130.

In an example implementation, an end surface of the at least one protrusion is offset from the leadframe by a fraction of the thickness of solder. The example implementation is consistent with that shown and described in connection with at least FIG. 6 with reference to the protrusions 122, when the protrusions 122 do not contact the fourth segment 130D of the leadframe 130.

In an example implementation, a cross-section along the length of the at least one protrusion is selected from one of oblong, circular and polygonal. In general, the at least one protrusion may be fabricated to exhibit any cross-section, but it may be advantageous for the at least one protrusion to have a substantially flat end surface. The example implementation is consistent with that shown and described in connection with at least FIG. 2 with reference to the protrusions 122 or the protrusions 126, each one of which exhibit a substantially flat end surface, but along a length may exhibit any cross-sectional geometry.

Additionally, the following numbered examples demonstrate one or more aspects of the disclosure.

Example 1

A semiconductor device package comprising a leadframe, at least one transistor that is solder-mounted to the leadframe and a conductive clip that has a first surface and a second surface and that is solder-mounted to the at least one transistor along the first surface, and that is solder-mounted to the leadframe along the second surface by a thickness of solder that is greater than or equal to a length of at least one protrusion that extends from the second surface.

Example 2

The semiconductor device package of example 1, wherein an end surface of the at least one protrusion abuts the leadframe.

Example 3

The semiconductor device package of any combination of examples 1-2, wherein an end surface of the at least one protrusion is offset from the leadframe by a fraction of the thickness of solder.

Example 4

The semiconductor device package of any combination of examples 1-3, wherein a cross-section along the length of the at least one protrusion is selected from one of: oblong; circular; and polygonal.

Example 5

The semiconductor device package of any combination of examples 1-4, wherein the conductive clip is solder-mounted to the at least one transistor along the first surface by a thickness of solder that is greater than or equal to a length of at least one protrusion that extends from the first surface.

Example 6

The semiconductor device package of any combination of examples 1-5, wherein an end surface of the at least one protrusion abuts a surface of the at least one transistor.

Example 7

The semiconductor device package of any combination of examples 1-6, wherein an end surface of the at least one protrusion is offset a surface of the at least one transistor by a fraction of the thickness of solder.

Example 8

The semiconductor device package of any combination of examples 1-7, wherein a cross-section along the length of the at least one protrusion is selected from one of: oblong; circular; and polygonal.

Example 9

A semiconductor device package, comprising a leadframe, a plurality of transistors each solder-mounted to the leadframe, and a conductive clip that has a first surface and a second surface and that is solder-mounted to the leadframe along the first surface by a first thickness of solder that is greater than or equal to a length of a protrusion of a first plurality of protrusions that extend from the first surface, and that is solder-mounted to each one of the plurality of transistors along the second surface by a second thickness of solder that is greater than or equal to a length of a protrusion of a second plurality of protrusions that extend from the second surface.

Example 10

The semiconductor device package of example 9, further comprising a controller that is solder-mounted to the leadframe and that is configured to drive each one of the plurality of transistors to develop a voltage on the conductive clip that is greater than or less than a voltage input to one of the plurality of transistors.

Example 11

The semiconductor device package of any combination of examples 9-10, wherein an end surface of the protrusion of the first plurality of protrusions that extend from the first surface abuts the leadframe.

Example 12

The semiconductor device package of any combination of examples 9-11, wherein an end surface of the protrusion of the first plurality of protrusions that extend from the first surface is offset from the leadframe by a fraction of the first thickness of solder.

Example 13

The semiconductor device package of any combination of examples 9-12, wherein a cross-section along the length of the protrusion of the first plurality of protrusions that extend from the first surface is selected from one of: oblong; circular; and polygonal.

Example 14

The semiconductor device package of any combination of examples 9-13, wherein the first plurality of protrusions that extend from the first surface are separated along a line of the first surface at a particular pitch.

Example 15

The semiconductor device package of any combination of examples 9-14, wherein an end surface of the protrusion of the second plurality of protrusions that extend from the second surface abuts a surface of one of the plurality of transistors.

Example 16

The semiconductor device package of any combination of examples 9-15, wherein an end surface of the protrusion of the second plurality of protrusions that extend from the second surface is offset from a surface of one of the plurality of transistors by a fraction of the second thickness of solder.

Example 17

The semiconductor device package of any combination of examples 9-16, wherein a cross-section along the length of the protrusion of the second plurality of protrusions that extend from the second surface is selected from one of: oblong; circular; and polygonal.

Example 18

The semiconductor device package of any combination of examples 9-17, wherein the second plurality of protrusions that extend from the second surface are spatially staggered along the second surface.

Example 19

The semiconductor device package of any combination of examples 9-18, wherein the first surface of the conductive clip is non-collinear with the second surface of the conductive clip.

Example 20

A semiconductor device package, comprising a leadframe, a plurality of transistors each solder-mounted to the leadframe, and a conductive clip that has a first surface and a second surface and that is solder-mounted to the leadframe along the first surface by a first thickness of solder that is greater than or equal to a length of a protrusion of a first plurality of protrusions that extend from the first surface and that are separated along a line of the first surface at a particular pitch, and that is solder-mounted to each one of the plurality of transistors along the second surface by a second thickness of solder that is greater than or equal to a length of a protrusion of a second plurality of protrusions that extend from the second surface and that are spatially staggered along the second surface.

Various examples of the disclosure have been described. Any combination of the described systems, operations, or functions is contemplated. These and other examples are within the scope of the following claims.

What is claimed is:

1. A semiconductor device package, comprising:
a leadframe;
at least one transistor that is solder-mounted to the leadframe; and
a conductive clip that has a first surface and a second surface and that is solder-mounted to the at least one transistor along the first surface, and that is solder-mounted to the leadframe along the second surface by a thickness of solder that is greater than or equal to a length of at least one protrusion that extends from the second surface to an end surface that is planar and along a direction that is normal to the second surface, wherein the end surface of the at least one protrusion directly abuts the leadframe.

2. The semiconductor device package of claim 1, wherein a cross-section along the length of the at least one protrusion is selected from one of: oblong; circular; and polygonal.

3. The semiconductor device package of claim 1, wherein the conductive clip is solder-mounted to the at least one transistor along the first surface by a thickness of solder that is greater than or equal to a length of at least one protrusion that extends from the first surface.

4. The semiconductor device package of claim 3, wherein an end surface of another protrusion of the conductive clip abuts a surface of the at least one transistor.

5. The semiconductor device package of claim 3, wherein an end surface of another protrusion of the conductive clip abuts from a surface of the at least one transistor.

6. The semiconductor device package of claim 3, wherein a cross-section along the length of the at least one protrusion is selected from one of: oblong; circular; and polygonal.

7. A semiconductor device package, comprising:
a leadframe;
a plurality of transistors each solder-mounted to the leadframe; and
a conductive clip that has a first surface and a second surface and that is solder-mounted to the leadframe along the first surface by a first thickness of solder that is greater than or equal to a length of a protrusion of a first plurality of protrusions that extend from the first surface, and that is solder-mounted to each one of the plurality of transistors along the second surface by a second thickness of solder that is greater than or equal to a length of a protrusion of a second plurality of protrusions that extend from the second surface.

8. The semiconductor device package of claim 7, further comprising a controller that is solder-mounted to the leadframe and that is configured to drive each one of the plurality of transistors to develop a voltage on the conductive clip that is greater than or less than a voltage input to one of the plurality of transistors.

9. The semiconductor device package of claim 7, wherein an end surface of the protrusion of the first plurality of protrusions that extend from the first surface abuts the leadframe.

10. The semiconductor device package of claim 7, wherein an end surface of the protrusion of the first plurality of protrusions that extend from the first surface is offset from the leadframe by a fraction of the first thickness of solder.

11. The semiconductor device package of claim 7, wherein a cross-section along the length of the protrusion of the first plurality of protrusions that extend from the first surface is selected from one of: oblong; circular; and polygonal.

12. The semiconductor device package of claim 7, wherein the first plurality of protrusions that extend from the first surface are separated along a line of the first surface at a particular pitch.

13. The semiconductor device package of claim 7, wherein an end surface of the protrusion of the second plurality of protrusions that extend from the second surface abuts a surface of one of the plurality of transistors.

14. The semiconductor device package of claim 7, wherein an end surface of the protrusion of the second plurality of protrusions that extend from the second surface is offset from a surface of one of the plurality of transistors by a fraction of the second thickness of solder.

15. The semiconductor device package of claim 7, wherein a cross-section along the length of the protrusion of the second plurality of protrusions that extend from the second surface is selected from one of: oblong; circular; and polygonal.

16. The semiconductor device package of claim 7, wherein the second plurality of protrusions that extend from the second surface are spatially staggered along the second surface.

17. The semiconductor device package of claim 7, wherein the first surface of the conductive clip is non-collinear with the second surface of the conductive clip.

18. A semiconductor device package, comprising:
- a leadframe;
- a plurality of transistors each solder-mounted to the leadframe; and
- a conductive clip that has a first surface and a second surface and that is solder-mounted to the leadframe along the first surface by a first thickness of solder that is greater than or equal to a length of a protrusion of a first plurality of protrusions that extend from the first surface and that are separated along a line of the first surface at a particular pitch, and that is solder-mounted to each one of the plurality of transistors along the second surface by a second thickness of solder that is greater than or equal to a length of a protrusion of a second plurality of protrusions that extend from the second surface and that are spatially staggered along the second surface.

* * * * *